US006461168B2

(12) United States Patent
Zeiss et al.

(10) Patent No.: US 6,461,168 B2
(45) Date of Patent: Oct. 8, 2002

(54) PLUG SOCKET FOR A DISPLAY INSTRUMENT

(75) Inventors: Manfred Zeiss, Rüsselsheim (DE); Thomas Ritter, Alzenau (DE)

(73) Assignee: Mannesmann VDO AG, Frankfurt (DE)

( * ) Notice: Subject to any disclaimer, the term of this patent is extended or adjusted under 35 U.S.C. 154(b) by 0 days.

(21) Appl. No.: 09/742,266

(22) Filed: Dec. 19, 2000

(65) Prior Publication Data

US 2001/0029117 A1 Oct. 11, 2001

(30) Foreign Application Priority Data

Dec. 21, 1999 (DE) ........................................ 199 62 120

(51) Int. Cl.[7] .......................... H01R 12/00; H05K 1/00
(52) U.S. Cl. ......................................... 439/60; 564/567
(58) Field of Search ............................ 439/60, 82, 550, 439/564, 567, 569, 573

(56) References Cited

U.S. PATENT DOCUMENTS 5,540,598 A * 7/1996 Davis .......................... 439/79
6,162,090 A * 12/2000 Klubenspies et al. ....... 439/564

FOREIGN PATENT DOCUMENTS

| | | |
|---|---|---|
| DE | 8904165 | 4/1990 |
| DE | 29723351 | 10/1998 |

OTHER PUBLICATIONS

Patent Abstracts of Japan 07085910 A 3/31/95.

* cited by examiner

*Primary Examiner*—Brian Sircus
*Assistant Examiner*—Hae Moon Hyeon
(74) *Attorney, Agent, or Firm*—Martin A. Farber

(57) ABSTRACT

A plug socket (1) has a plug housing (2) with a baseplate (3). The baseplate (3) has a respective contact surface (9,10) on two opposite sides in order to seat it on a printed circuit board. A contact spring (6) has two support regions (7,8) which are curved in the shape of an arc in opposite directions and which together form the shape of an S lying on its side. The contact spring (6) permits conductor track contact both in the case of surface mounting and plug-in mounting for the plug socket (1).

6 Claims, 1 Drawing Sheet

PLUG SOCKET FOR A DISPLAY INSTRUMENT

Clam is hereby made of the benefit of the filing date of the German Patent Application 199 62 120.9 filed Dec. 21, 1999 under 35 USC 119 .

FIELD AND BACKGROUND OF THE INVENTION

The invention relates to a plug socket, particularly in a display instrument in a motor vehicle, which plug socket has a baseplate with a contact surface in order to place it on a printed circuit board and, in order to make contact with a respective conductor track on the printed circuit board, has a respective contact spring having a support region which is curved in the shape of an arc and projects beyond the contact surface of the baseplate when the baseplate is not seated on the printed circuit board.

Plug sockets of the above type are used, for example, to connect a combined instrument in a vehicle to a plug, so that it is connected to an electrical power supply and to data lines. To connect the plug socket to the printed circuit board, two mounting methods are customary. In the case of surface mounting, the baseplate of the plug socket is seated on the printed circuit board. In the case of plug-in mounting, the printed circuit board has an aperture through which the plug socket is pushed until the baseplate meets the printed circuit board from the insertion side. To date, differently designed plug sockets are required for these two types of mounting, and it has been found to be advantageous in both cases if the electrical connections between the plug socket and the conductor tracks do not have to be produced by means of solder connections. This is avoided by seating the contact region of a prestressed contact spring on the conductor track with which contact can be made for each electrical connection.

SUMMARY OF THE INVENTION

The invention is based on the object of providing a plug socket of the type mentioned in the introduction such that it is suitable both for surface mounting and plug-in mounting.

According to the inventon the baseplate has a respective contact surface on two opposite sides in order to seat it on the printed circuit board, and the contact spring has, in addition to the first support region curved in the shape of an arc, a second support region, which is curved in the shape of an arc towards the opposite side and, together with the first support region, forms the shape of an S lying on its side.

The effect achieved by this formation of the contact spring is that either one support region or the other support region of the contact spring makes contact with a conductor track, depending on whether plug-in mounting or surface mounting is being used. The plug socket according to the invention can therefore be used without modification for the two mounting methods. In addition, the plug socket according to the invention is suitable for SMD purposes (SMD=Surface Mounted Device) and can therefore be processed simply and cost-effectively. The plug socket's flexibility, guaranteeing simple handling, minimal stockholding costs and also rapid and reliable mounting of the plug socket according to the invention, is of particular advantage in display instruments in motor vehicles, because this area requires production in very high numbers, with a very large and constantly changing range of variants and at very low costs.

For the purpose of precisely positioning plug sockets, the baseplate usually has positioning projections arranged on it which engage in corresponding apertures in the printed circuit board after the plug socket has been fitted. Exact positioning of the plug socket is advantageously possible in the case of both types of mounting if each contact surface has at least one respective positioning projection projecting from the plane of the contact surface.

The plug socket can also be secured very simply in the case of both types of mounting if each contact surface has at least one respective holding element projecting from the plane of the contact surface.

The plug socket could be a metal component, e.g. a stamped and bent sheet metal element. In accordance with one advantageous development of the invention, the plug socket can also be produced particularly cost-effectively in large numbers and additionally has electrical insulation if the plug socket is a plastic injection-molded part into which electrically conductive sockets or plug tabs are inserted or injection-molded.

The plug socket could conceivably be designed in a circular shape for the purpose of connection to a corresponding plug which likewise has a circular cross section. On the other hand, the plug socket has a particularly low space requirement and a high level of mounting reliability if, in accordance with another advantageous development of the invention, connecting sockets and/or plug tabs arranged in a row next to one another are arranged in a housing. In this context, it is possible to provide—depending on the desired embodiment—sockets, into which tabs can be inserted, or tabs, onto which sockets can be plugged. It is also of particular advantage in this context if the end faces of the plug socket are designed such that a plurality of plug sockets can be lined up in a row in order to multiply the number of poles.

BRIEF DESCRIPTION OF THE DRAWING

The invention has various embodiments. One of these is shown in figures of the drawing and is described below. In the drawing.

DETAILED DESCRIPTION OF THE PREFERRED EMBODIMENT

Figure 1:
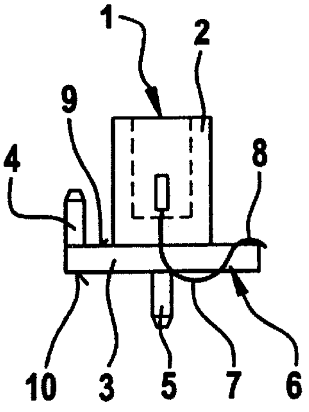
FIG. 1 shows a schematic side view of a plug socket according to the invention.

FIG. 1 shows a plug socket 1 which has a plug housing 2 which is arranged upright on a baseplate 3. The plug housing 2 is connected to the baseplate 3 to form a single component. Projecting both upward and downward from the baseplate 3 are positioning projections 4,5. Of particular importance is the design of a contact spring 6, which is in the shape of an S lying on its side and has two support regions 7,8 which are curved in opposite directions. In the unfitted state shown in FIG. 1, the first support region 8 of the contact spring 6 protrudes above a top contact surface 9 of the baseplate 3, and the second support region 7 protrudes above a bottom contact surface 10 of the baseplate 3.

Figure 2:
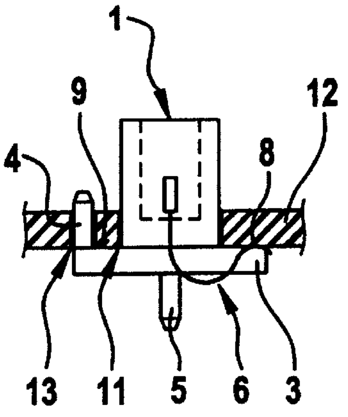
FIG. 2 shows a section through a sub-region of a printed circuit board having the plug socket mounted by plug-in mounting.

FIG. 2 shows how the plug socket 1 is seated in a cutout 11 in a printed circuit board 12 after plug-in mounting. In this case, the first positioning projection 4 on the baseplate 3 engages through a positioning opening 13 in the printed circuit board 12 and positions the plug socket 1 in this manner. The second positioning projection 5 protrudes freely into space and has no function. The first support region 8 of the contact spring 6 bears against a conductor track (not shown) on the printed circuit board 12. At the same time, the top contact surface 9 bears against the printed circuit board 12 as a stop for the plug socket 1.

Figure 3:
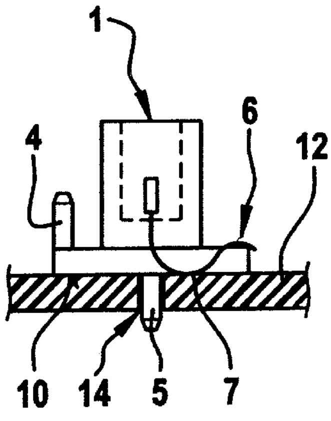
FIG. 3 shows a section through a sub-region of a printed circuit board having the plug socket mounted by surface mounting.

FIG. 3 shows the circumstances for surface mounting. In this case, the second positioning projection 5 protrudes through a positioning opening 14 in the printed circuit board 12, while the first positioning projection 4 has no function. In FIG. 3, the support region 7 of the contact spring 6 bears against a conductor track (not shown) on the printed circuit board 12. In this case, the bottom contact surface 10 of the baseplate 3 serves as a stop for the plug socket 1 on the printed circuit board 12.

Figure 4:
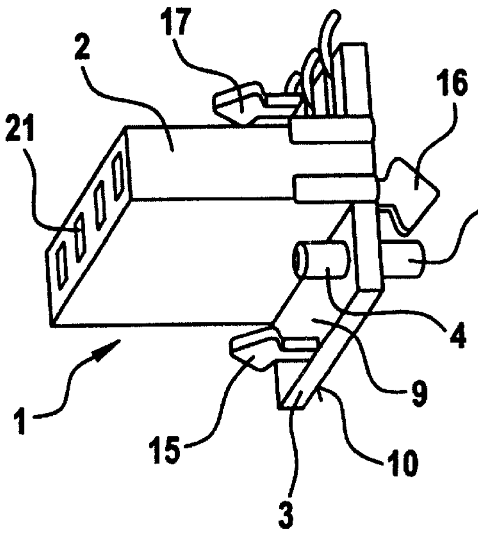
FIG. 4 shows a perspective view of a plug socket according to the invention.

The design of the plug socket 1 can be seen in more detail from the perspective illustration shown in FIG. 4. Once again, the plug housing 2 and the baseplate 3 can be seen. It is likewise possible to see the positioning projections 4,5, which are aligned with one another in this embodiment. Arranged next to one another in a row in the plug housing 2 are four connecting sockets 21 for holding a respective plug tab on a plug (not shown here). In addition to the preceding figures, FIG. 4 shows the holding elements 15,16,17, which allow the plug socket 1 to be mounted as shown in FIGS. 2 and 3. In this case, when the plug socket 1 is mounted on a printed circuit board by pushing it through, the holding elements 15,17 protruding from the top contact surface 9 of the baseplate 3 are inserted into corresponding cutouts in the printed circuit board; in the case of surface mounting, the holding element 16 protruding from the bottom contact surface 10 is inserted in a corresponding way into a corresponding cutout in the printed circuit board. In each case, the holding elements 15,16,17 lock the plug socket 1 on the printed circuit board.

Figure 5:
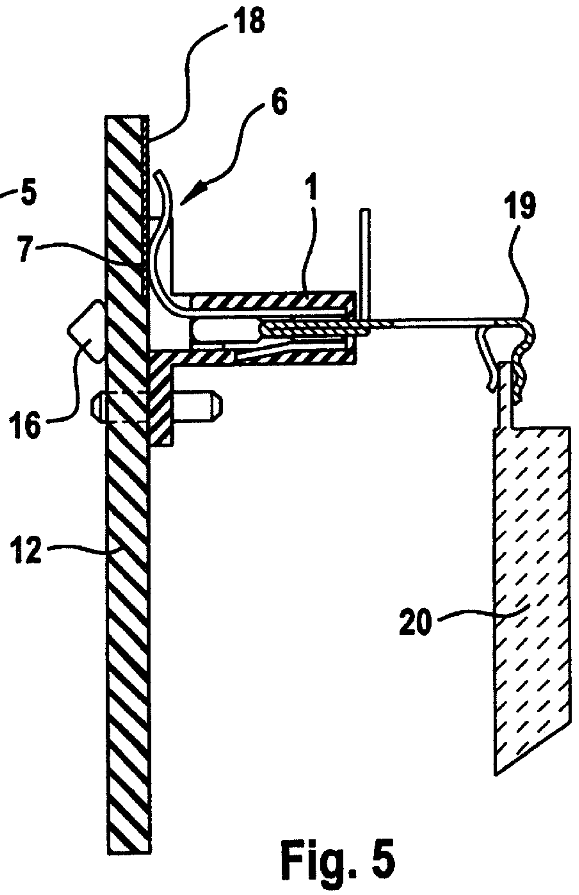
FIG. 5 shows a section through a sub-region of a printed circuit board having the plug socket and a component connected thereto.

FIG. 5 shows the printed circuit board 12 with a conductor track 18. Seated on this printed circuit board 12 is the plug socket 1. The plug socket 1 makes contact with the conductor track 18 by means of the support region 7 of the contact spring 6. Inserted into the plug socket 1 is a contact part 19 by means of which a liquid crystal cell 20 is electrically connected to the conductor track 18. The holding element 16 passes through the printed circuit board 12 and thereby fixes the plug socket 1 on the printed circuit board 12.

What is claimed is:

1. A plug socket, for a display instrument in a motor vehicle, the plug socket having a base plate, the base plate having at least a bottom side and a top side, said bottom side and top side facing in opposite directions with the plug socket being arranged on the top side, said bottom side and top side each having a contact surface, the base plate able to be seated on one side of a printed circuit board, wherein either said contact surface of said top side or said contact surface of said bottom side contacts a side of the printed circuit board and wherein, when said contact surface of said top side contacts the side of the printed circuit board, the plug housing protrudes through an aperture in the printed circuit board in order to make contact with a conductor track on the side of the printed circuit board, said plug socket further comprising at least one resilient contact spring having a first support region and a second support region both said first and second support regions being curved in the shape of an arc and together form the shape of an S lying on its side wherein the first support region projects beyond the botton contact surface when the base plate is not seated on the printed circuit board and wherein only one of the first and second support regions contacts the conductor track depending on which of said contact surfaces of said top and bottom sides is seated on the side of the printed circuit board.

2. The plug socket as claimed in claim 1, wherein each contact surface (9,10) has at least one respective positioning projection (4,5) projecting from a plane of the contact surface (9,10).

3. The plug socket as claimed in claim 1, wherein each contact surface (9,10) has at least one respective holding element (15,16,17) projecting from a plane of the contact surface (9,10).

4. The plug socket as claimed in claim 1, wherein the plug socket (1) is a plastic injection-moulded part.

5. The plug socket as claimed in claim 1, further comprising a housing, and connecting sockets (21) and/or plug tabs arranged in a row next to one another are arranged in said housing (2).

6. The plug socket as claimed in claim 2, wherein each contact surface (9,10) has at least one respective holding element (15,16,17) projecting from the plane of the contact surface (9,10).

* * * * *